(12) United States Patent (10) Patent No.: US 12,562,348 B2

Ishikawa et al. (45) **Date of Patent: *Feb. 24, 2026**

(54) PLASMA PROCESSING APPARATUS

(71) Applicant: Tokyo Electron Limited, Tokyo (JP)

(72) Inventors: Shinya Ishikawa, Miyagi (JP); Daiki Hariu, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 660 days.

This patent is subject to a terminal disclaimer.

(21) Appl. No.: 17/940,020

(22) Filed: Sep. 8, 2022

(65) Prior Publication Data

US 2023/0090650 A1 Mar. 23, 2023

(30) Foreign Application Priority Data

Sep. 17, 2021 (JP) ................................. 2021-152386

(51) Int. Cl.
*H01J 37/32* (2006.01)
*H01L 21/683* (2006.01)

(52) U.S. Cl.
CPC .. *H01J 37/32568* (2013.01); *H01J 37/32174* (2013.01); *H01J 37/3244* (2013.01);
(Continued)

(58) Field of Classification Search
CPC ........... H01J 37/32027; H01J 37/32036; H01J 37/32091; H01J 37/32174; H01J 37/3244;
(Continued)

(56) References Cited

U.S. PATENT DOCUMENTS

| | | | |
|---|---|---|---|
| 6,558,508 B1 * | 5/2003 | Kawakami | ........ H01L 21/67103 118/728 |
| 2008/0110874 A1 * | 5/2008 | Hayashi | ............ H01L 21/67103 219/468.1 |

(Continued)

FOREIGN PATENT DOCUMENTS

| | | |
|---|---|---|
| JP | 2011-525694 A | 9/2011 |
| JP | 2014072355 A * | 4/2014 |

(Continued)

*Primary Examiner* — Gordon Baldwin
*Assistant Examiner* — Todd M Seoane
(74) *Attorney, Agent, or Firm* — XSENSUS LLP

(57) ABSTRACT

There is provided a plasma processing apparatus comprising: a plasma processing chamber; a substrate support disposed in the plasma processing chamber, the substrate support including: a base, a ceramic member disposed on the base and having a substrate support surface and a ring support surface, one more annular members disposed on the ring support surface to surround a substrate on the substrate support surface, first and second central electrodes inserted into the ceramic member, first to fourth vertical connectors inserted into the ceramic member, first and second annular connectors inserted into the ceramic member, and a central heater electrode inserted into the ceramic member; a DC power source electrically connected to an outer region of the first annular connector through the third vertical connector; and a voltage pulse generator electrically connected to an outer region of the second annular connector through the fourth vertical connector.

16 Claims, 8 Drawing Sheets

(52) U.S. Cl.
CPC .. *H01J 37/32541* (2013.01); *H01J 37/32577* (2013.01); *H01J 37/32724* (2013.01); *H01L 21/6833* (2013.01)

(58) Field of Classification Search
CPC ........... H01J 37/32532; H01J 37/32541; H01J 37/32568; H01J 37/32577; H01J 37/32724; H01J 2237/2007; H01J 2237/334; H01L 21/6833
See application file for complete search history.

(56) References Cited

U.S. PATENT DOCUMENTS

| | | | | |
|---|---|---|---|---|
| 2014/0069584 A1 * | 3/2014 | Yang | ................ | H01J 37/32082 |
| | | | | 156/345.44 |
| 2016/0035611 A1 * | 2/2016 | Kutter | ................ | H01L 21/6833 |
| | | | | 361/234 |
| 2019/0013222 A1 * | 1/2019 | Kim | ................ | H01J 37/32724 |
| 2020/0286717 A1 | 9/2020 | Cho et al. | | |
| 2023/0087660 A1 * | 3/2023 | Ishikawa | ........... | H01L 21/67109 |
| | | | | 156/345.51 |

FOREIGN PATENT DOCUMENTS

| | | | | | |
|---|---|---|---|---|---|
| WO | WO-2010008711 A2 * | 1/2010 | | ........... | H01L 21/205 |
| WO | WO-2019169102 A1 * | 9/2019 | | .............. | B23Q 3/15 |

* cited by examiner

CROSS-SECTION V – V

115b1

115b2

116c3
116c1 } 116c
116c2

114

118c

CROSS-SECTION VII-VII

PLASMA PROCESSING APPARATUS

CROSS-REFERENCE TO RELATED APPLICATIONS

This application claims priority to Japanese Patent Application No. 2021-152386 filed on Sep. 17, 2021, the entire contents of which are incorporated herein by reference.

TECHNICAL FIELD

The present disclosure relates to a plasma processing apparatus.

BACKGROUND

US Patent Application Publication No. 2020/0286717 discloses a plasma processing chamber including an electrostatic chuck formed by laminating a cooling plate and a dielectric plate. A plurality of electrodes are disposed inside the electrostatic chuck described in US Patent Application Publication No. 2020/0286717.

SUMMARY

The present disclosure provides an improved electrode structure capable of efficiently supplying electric power to an electrode in a substrate support.

In accordance with an aspect of the present disclosure, there is provided a plasma processing apparatus comprising: a plasma processing chamber; a substrate support disposed in the plasma processing chamber, the substrate support including: a base, a ceramic member disposed on the base and having a substrate support surface and a ring support surface, the ceramic member including a gas distribution space, at least one gas inlet extending from a lower surface of the ceramic member to the gas distribution space and a plurality of gas outlets extending from the gas distribution space to the substrate support surface or the ring support surface, one or more annular members disposed on the ring support surface to surround the substrate on the substrate support surface, first and second central electrodes inserted into the ceramic member, the first central electrode being disposed below the substrate support surface and the second central electrode being disposed below the first central electrode, first to fourth vertical connectors inserted into the ceramic member and extending in a vertical direction, first and second annular connectors inserted into the ceramic member and extending in a horizontal direction, an inner region of the first annular connector being disposed below an edge region of the first central electrode and electrically connected to the edge region of the first central electrode through the first vertical connector and an inner region of the second annular connector being disposed below an edge region of the second central electrode and electrically connected to the edge region of the second central electrode through the second vertical connector, and a central heater electrode inserted into the ceramic member and having one or more divided regions, a portion or the entirety of the gas distribution space being formed between the first annular connector and the central heater electrode and further formed between the second annular connector and the central heater electrode; a DC power source electrically connected to an outer region of the first annular connector through the third vertical connector and configured to generate a DC signal; and a voltage pulse generator electrically connected to an outer region of the second annular connector through the fourth vertical connector and configured to generate a sequence of voltage pulses.

DETAILED DESCRIPTION

Figure 1:
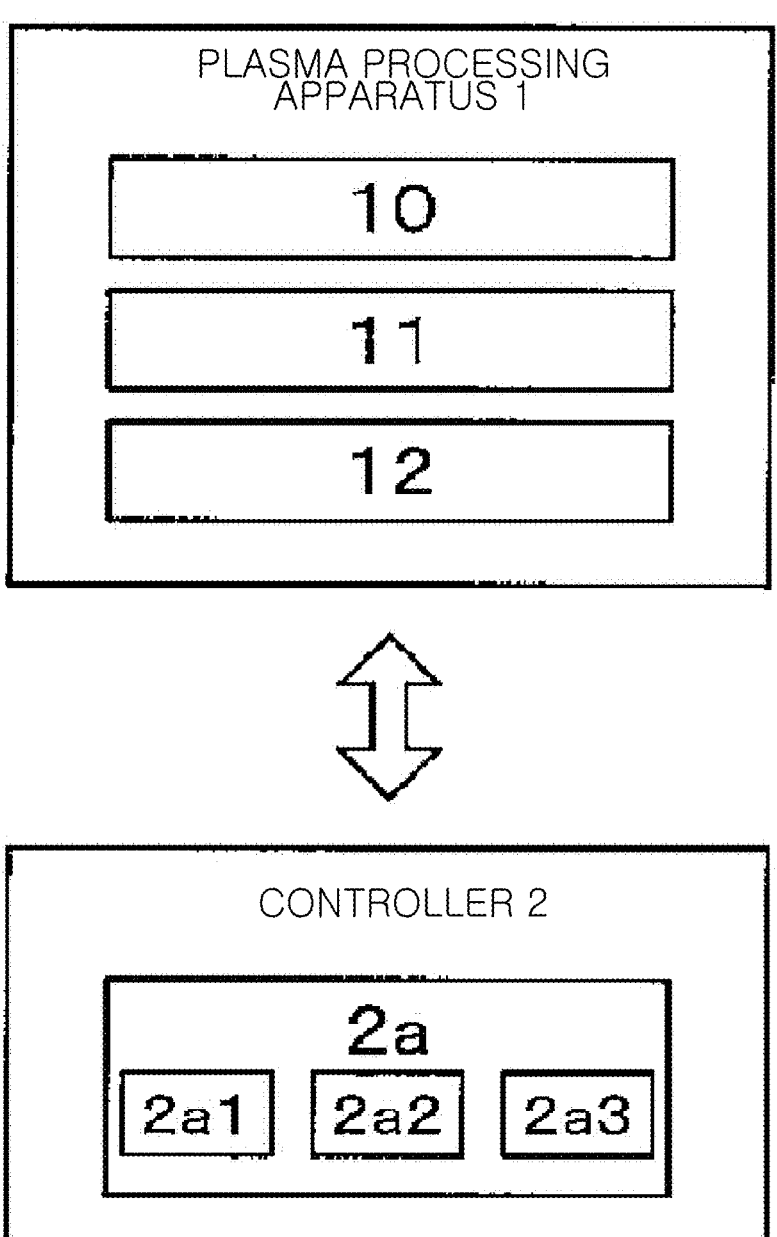
FIG. 1 is an explanatory diagram schematically illustrating a configuration of a plasma processing system according to the present embodiment.

In a semiconductor device manufacturing process, plasma is generated by exciting a processing gas supplied into a chamber, and various plasma processings such as etching, film formation, or diffusion are performed on a semiconductor substrate (hereinafter, simply referred to as "substrate") supported on a substrate support. The substrate support for supporting the substrate is provided with, for example, an electrostatic chuck for adsorbing and holding the substrate on a mounting surface by a Coulomb force or the like and an electrode portion to which bias power or adsorption power of the substrate is supplied during a plasma processing.

In the plasma processing described above, in order to increase the uniformity of process characteristics with respect to the substrate, it is required to uniformly control a temperature distribution of the substrate to be processed. The temperature distribution of the substrate in plasma processing is adjusted, for example, by providing a plurality of heating devices (heaters, etc.) inside the electrostatic chuck and controlling a temperature of the mounting surface at each of a plurality of temperature adjustment regions defined by these heating devices.

Here, the bias power and adsorption power supplied to the aforementioned electrode portion may leak into the corresponding heating device as a noise component due to capacitive coupling between the electrode portion and the heating device. For this reason, in the related art, a filter is provided in the heating device to remove the noise component. However, in particular, when direct current (DC) pulse power is used as bias power, it may be difficult to properly remove the noise component in the related art filter, it may be impossible to properly perform plasma processing on the substrate without generating a peak of ion energy.

The technology according to the present disclosure has been made in view of the above circumstances, and provides an improved electrode structure capable of efficiently supplying electric power to an electrode in a substrate support. Hereinafter, a configuration of a substrate processing apparatus according to an embodiment will be described with reference to the accompanying drawings. In addition, in this disclosure, the same reference numerals are used for the elements substantially having the same functions, and redundant descriptions thereof are omitted.

<Plasma Processing System>

FIG. 1 is a diagram illustrating a configuration example of a plasma processing system. In an embodiment, the plasma processing system includes a plasma processing apparatus 1 and a controller 2. The plasma processing system is an example of a substrate processing system, and the plasma processing apparatus 1 is an example of a substrate processing apparatus. The plasma processing apparatus 1 includes a plasma processing chamber 10, a substrate support 11, and a plasma generator 12. The plasma processing chamber 10 has a plasma processing space. In addition, the plasma processing chamber 10 has at least one gas inlet for supplying at least one processing gas to the plasma processing space and at least one gas outlet for exhausting gases from the plasma processing space. The gas inlet is connected to a gas supply 20 described below, and the gas outlet is connected to an exhaust system 40 described below. The substrate support 11 is disposed in the plasma processing space and has a substrate support surface for supporting the substrate.

The plasma generator 12 is configured to generate a plasma from at least one processing gas supplied into the plasma processing space. A plasma formed in the plasma processing space may be a capacitively coupled plasma (CCP), an inductively coupled plasma (ICP), an electron-cyclotron-resonance (ECR) plasma, a helicon wave plasma (HWP), or a surface wave plasma (SWP). In addition, various types of plasma generators including an alternating current (AC) plasma generator and a direct current (DC) plasma generator may be used. In an embodiment, an AC signal (AC power) used by the AC plasma generator has a frequency in the range of 100 kHz to 10 GHz. Accordingly, the AC signal includes a radio frequency (RF) signal and a microwave signal. In an embodiment, the RF signal has a frequency in the range of 100 kHz to 150 MHz.

The controller 2 processes computer-executable instructions for causing the plasma processing apparatus 1 to execute various processes described in the present disclosure. The controller 2 may be configured to control each element of the plasma processing apparatus 1 to perform various processes described herein. In an embodiment, a part or the entirety of the controller 2 may be included in the plasma processing apparatus 1. The controller 2 may include, for example, the computer 2a. The computer 2a may include, for example, a central processing unit (CPU) 2a1, a storage 2a2, and a communication interface 2a3. The CPU 2a1 may be configured to read a program from the storage 2a2 and perform various control operations by executing the read program. This program may be previously stored in the storage 2a2 or may be acquired through a medium when necessary. The acquired program is stored in the storage 2a2 and read from the storage 2a2 by the CPU 2a1 and executed. The medium may be various storage mediums readable by the computer 2a or may be a communication line connected to the communication interface 2a3. The storage 2a2 may include a random access memory (RAM), a read only memory (ROM), a hard disk drive (HDD), a solid state drive (SSD), or a combination thereof. The communication interface 2a3 may communicate with the plasma processing apparatus 1 via a communication line such as a local area network (LAN).

<Plasma Processing Apparatus>

Figure 2:
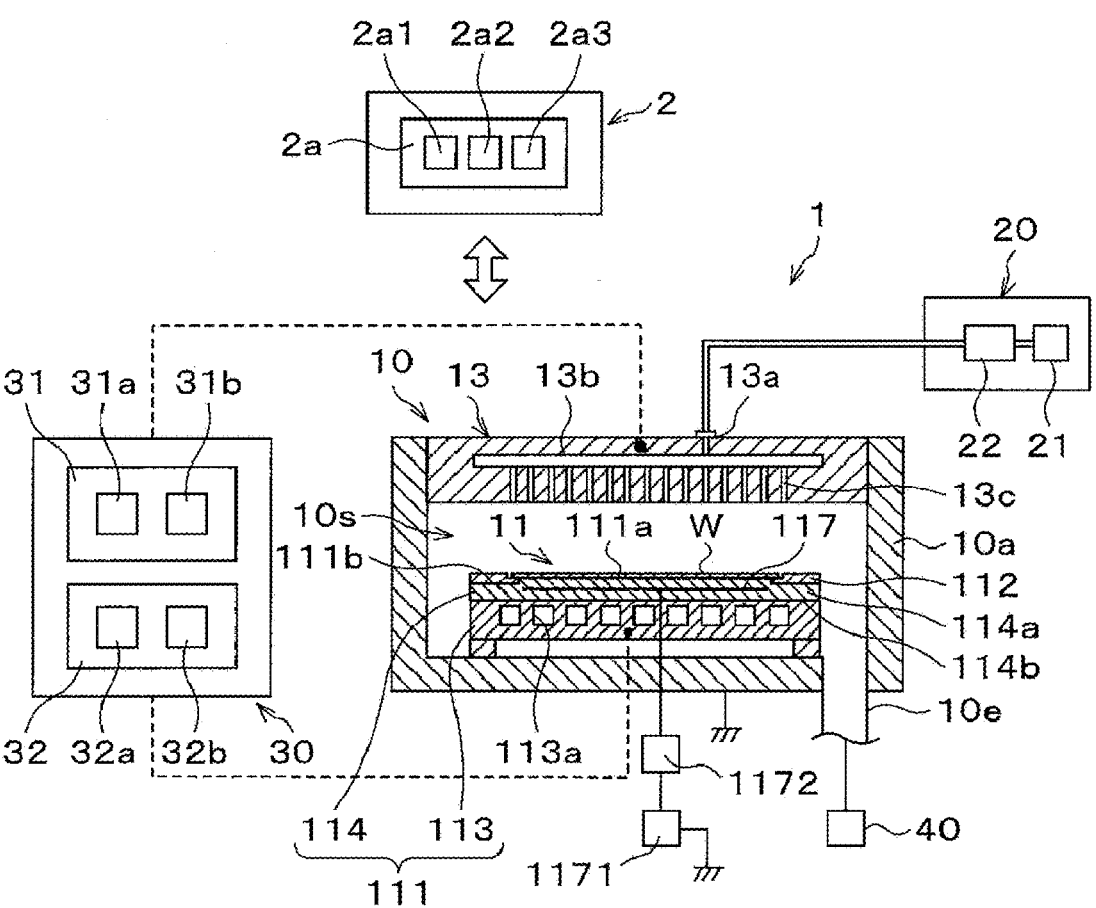
FIG. 2 is a cross-sectional view illustrating an example of a configuration of a plasma processing apparatus according to the present embodiment.

Next, a configuration example of a capacitively coupled plasma processing apparatus as an example of the plasma processing apparatus 1 is described. FIG. 2 is a diagram illustrating a configuration example of a capacitively coupled plasma processing apparatus.

The capacitively coupled plasma processing apparatus 1 includes a plasma processing chamber 10, a gas supply 20, a power source 30, and an exhaust system 40. Moreover, the plasma processing apparatus 1 includes the substrate support 11 and a gas introduction unit. The gas introduction unit is configured to introduce at least one processing gas into the plasma processing chamber 10. The gas introduction unit includes a showerhead 13. The substrate support 11 is disposed in the plasma processing chamber 10. The showerhead 13 is disposed above the substrate support 11. In an embodiment, the showerhead 13 constitutes at least a portion of a ceiling of the plasma processing chamber 10. The plasma processing chamber 10 has a plasma processing space 10s defined by the showerhead 13, a sidewall 10a of the plasma processing chamber 10, and the substrate support 11. The plasma processing chamber 10 is grounded. The showerhead 13 and the substrate support 11 are electrically insulated from a housing of the plasma processing chamber 10.

The substrate support 11 includes a body 111 and a ring assembly 112. The body 111 has a central region 111a for supporting a substrate W and an annular region 111b for supporting the ring assembly 112. A wafer is an example of the substrate W. The annular region 111b of the body 111 surrounds the central region 111a of the body 111 in a plan view. The substrate W is disposed on the central region 111a of the body 111, and the ring assembly 112 is disposed on the annular region 111b of the body 111 to surround the substrate W on the central region 111a of the body 111. Accordingly, the central region 111a is also referred to as a substrate support surface for supporting the substrate W, and the annular region 111b is also referred to as a ring support surface for supporting the ring assembly 112.

Further, in an embodiment, the body 111 includes a base 113 and an electrostatic chuck 114. The base 113 includes a conductive member. The conductive member of the base 113 may function as a lower electrode. The electrostatic chuck 114 is disposed on the base 113. The electrostatic chuck 114 includes a ceramic member 114a, a plurality of electrodes disposed in the ceramic member 114a, and a gas distribution space formed in the ceramic member 114a. The plurality of electrodes include one or more electrostatic electrodes 115 to be described below and one or more bias electrodes 116 that may function as lower electrodes. The ceramic member 114a has the central region 111a. In an embodiment, the ceramic member 114a also has the annular region 111b. In addition, another member surrounding the electrostatic chuck 114, such as an annular electrostatic chuck or an annular insulating member, may have the annular region 111b. In this case, the ring assembly 112 may be disposed on the annular electrostatic chuck or the annular insulating member, or may be disposed on both the electrostatic chuck 114 and the annular insulating member.

The ring assembly 112 includes one or more annular members. In an embodiment, one or more annular member includes one or more edge rings and at least one cover ring. The edge ring is formed of a conductive material or an insulating material, and the cover ring is formed of an insulating material.

Further, the substrate support 11 includes a temperature control module configured to adjust at least one of the ring assembly 112, the electrostatic chuck 114, and the substrate W to a target temperature. As shown in FIG. 2, in an embodiment, the temperature control module includes a heater electrode 117 to be described below disposed inside the electrostatic chuck 114 and a flow path 113a formed inside the base 113. A heat transfer fluid such as brine or gas flows through the flow path 113a. In addition, the configuration of the temperature control module is not limited thereto, and it may be configured to control a temperature of at least one of the ring assembly 112, the electrostatic chuck 114, and the substrate W.

In addition, the substrate support 11 may include a heat transfer gas supply 118 (refer to FIG. 3 or 7 to be described below) configured to supply a heat transfer gas between a back surface of the substrate W and the central region 111a or between a back surface of the ring assembly 112 and the annular region 111b.

In addition, a detailed configuration of the substrate support 11 included in the plasma processing apparatus 1 according to the technology of the present disclosure is described below.

The showerhead 13 is configured to introduce at least one processing gas from the gas supply 20 into the plasma processing space 10s. The showerhead 13 has at least one gas inlet 13a, at least one gas diffusion space 13b, and a plurality of gas introduction ports 13c. The processing gas supplied to the gas inlet 13a passes through the gas diffusion space 13b to be introduced into the plasma processing space 10s from the plurality of gas introduction ports 13c. In addition, the showerhead 13 includes an upper electrode. Further, in addition to the showerhead 13, a gas introduction unit may include one or more side gas injectors (SGIs) installed in one or more openings formed in the sidewall 10a.

The gas supply 20 may include at least one gas source 21 and at least one flow controller 22. In an embodiment, the gas supply 20 is configured to supply at least one processing gas from a corresponding gas source 21 to the showerhead 13 through a corresponding flow controller 22. Each flow controller 22 may include, for example, a mass flow controller or a pressure-controlled flow controller. Also, the gas supply 20 may include at least one flow modulation device for modulating or pulsing a flow of at least one processing gas.

The power source 30 includes an RF power source 31 coupled to the plasma processing chamber 10 through at least one impedance matching circuit. The RF power source 31 is configured to supply at least one RF signal (RF power) such as a source RF signal and a bias RF signal to the lower electrode and/or the upper electrode. As a result, a plasma is formed from at least one processing gas supplied to the plasma processing space 10s. Accordingly, the RF power source 31 may function as at least a part of the plasma generator 12. In addition, by supplying the bias RF signal to the lower electrode, a bias potential is generated in the substrate W and ion components in the formed plasma may be attracted to the substrate W.

In an embodiment, the RF power source 31 includes a first RF generator 31a and a second RF generator 31b. The first RF generator 31a is coupled to the lower electrode and/or the upper electrode through at least one impedance matching circuit and is configured to generate a source RF signal (source RF power) for plasma generation. In an embodiment, the source RF signal has a frequency in the range of 10 MHz to 150 MHz. In an embodiment, the first RF generator 31a may be configured to generate a plurality of source RF signals having different frequencies. The generated one or more source RF signals are supplied to the lower electrode and/or the upper electrode.

The second RF generator 31b is coupled to the lower electrode through at least one impedance matching circuit and is configured to generate a bias RF signal (bias RF power). A frequency of the bias RF signal may be the same as or different from the frequency of the source RF signal. In an embodiment, the bias RF signal has a lower frequency than the frequency of the source RF signal. In an embodiment, the bias RF signal has a frequency in the range of 100 kHz to 60 MHz. In an embodiment, the second RF generator 31b may be configured to generate a plurality of bias RF signals having different frequencies. Generated one or more bias RF signals are supplied to the lower electrode. Further, in various embodiments, at least one of the source RF signal and the bias RF signal may be pulsed.

Further, the power source 30 may include a DC power source 32 coupled to the plasma processing chamber 10. The DC power source 32 includes a first DC generator 32a and a second DC generator 32b. In an embodiment, the first DC generator 32a is connected to the lower electrode and is configured to generate a first DC signal. The generated first DC signal is applied to the lower electrode. In an embodiment, the second DC generator 32b is connected to the upper electrode and is configured to generate a second DC signal. The generated second DC signal is applied to the upper electrode.

In various embodiments, the first and second DC signals may be pulsed. In this case, a sequence of voltage pulses based on DC is applied to the lower electrode and/or the upper electrode. The voltage pulse may have a pulse waveform of a rectangle, a trapezoid, a triangle, or a combination thereof. In an embodiment, a waveform generator for generating a sequence of voltage pulses from a DC signal is connected between the first DC generator 32a and the lower electrode. Accordingly, the first DC generator 32a and the waveform generator constitute a voltage pulse generator. When the second DC generator 32b and the waveform generator constitute a voltage pulse generator, the voltage pulse generator is connected to the upper electrode. The voltage pulse may have a positive polarity or a negative polarity. In addition, the sequence of voltage pulses may include one or more positive voltage pulses and one or more negative voltage pulses within one period. In addition, the first and second DC generators 32a and 32b may be provided in addition to the RF power source 31, and the first DC generator 32a may be provided instead of the second RF generator 31b.

The exhaust system 40 may be connected to, for example, a gas outlet 10e provided at the bottom of the plasma processing chamber 10. The exhaust system 40 may include a pressure regulating valve and a vacuum pump. Pressure in the plasma processing space 10s is regulated by the pressure regulating valve. The vacuum pump may include a turbo molecular pump, a dry pump, or a combination thereof.

<Substrate Support>

Next, a detailed configuration example of the aforementioned substrate support 11 is described.

As described above, the substrate support 11 includes the body 111 and the ring assembly 112, and the body 111 includes the base 113 and the electrostatic chuck 114. In addition, the electrostatic chuck 114 has the central region 111a supporting the substrate W and the annular region 111b supporting the ring assembly 112 on an upper surface thereof.

Figure 3:
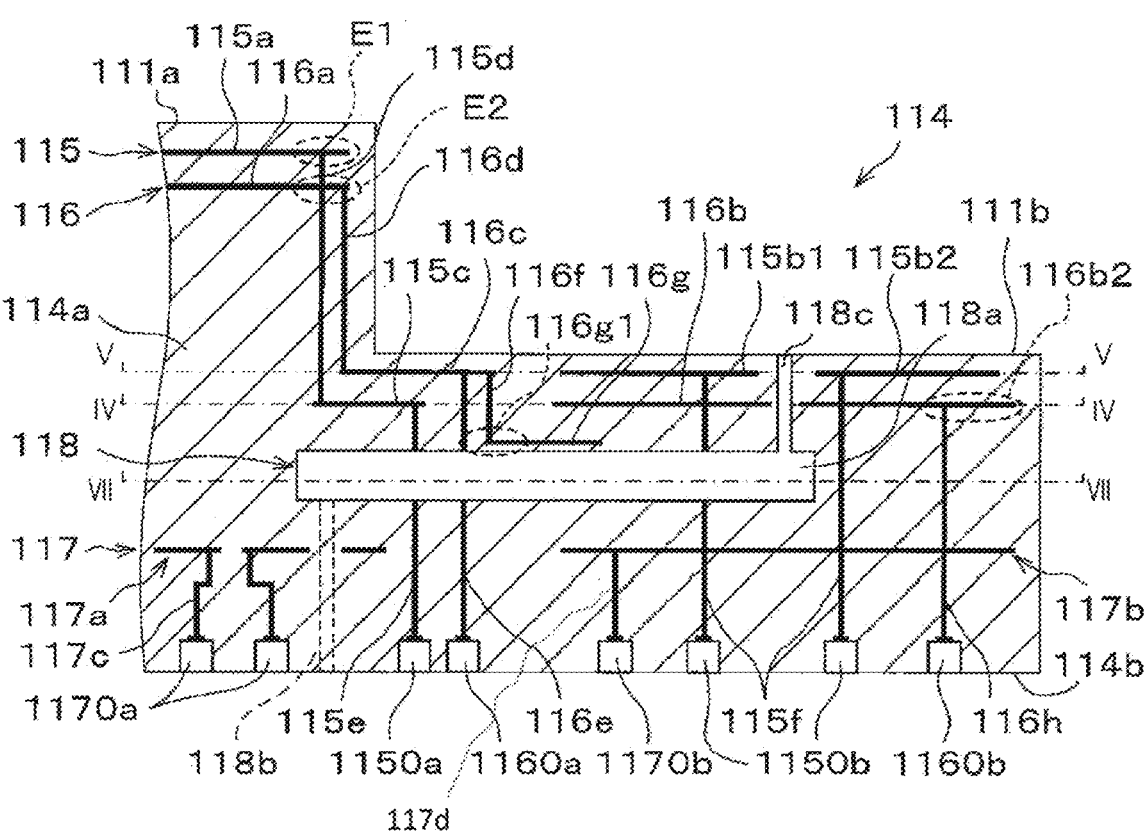
FIG. 3 is a cross-sectional view schematically illustrating a configuration of an electrostatic chuck constituting a substrate support.
Figure 4:
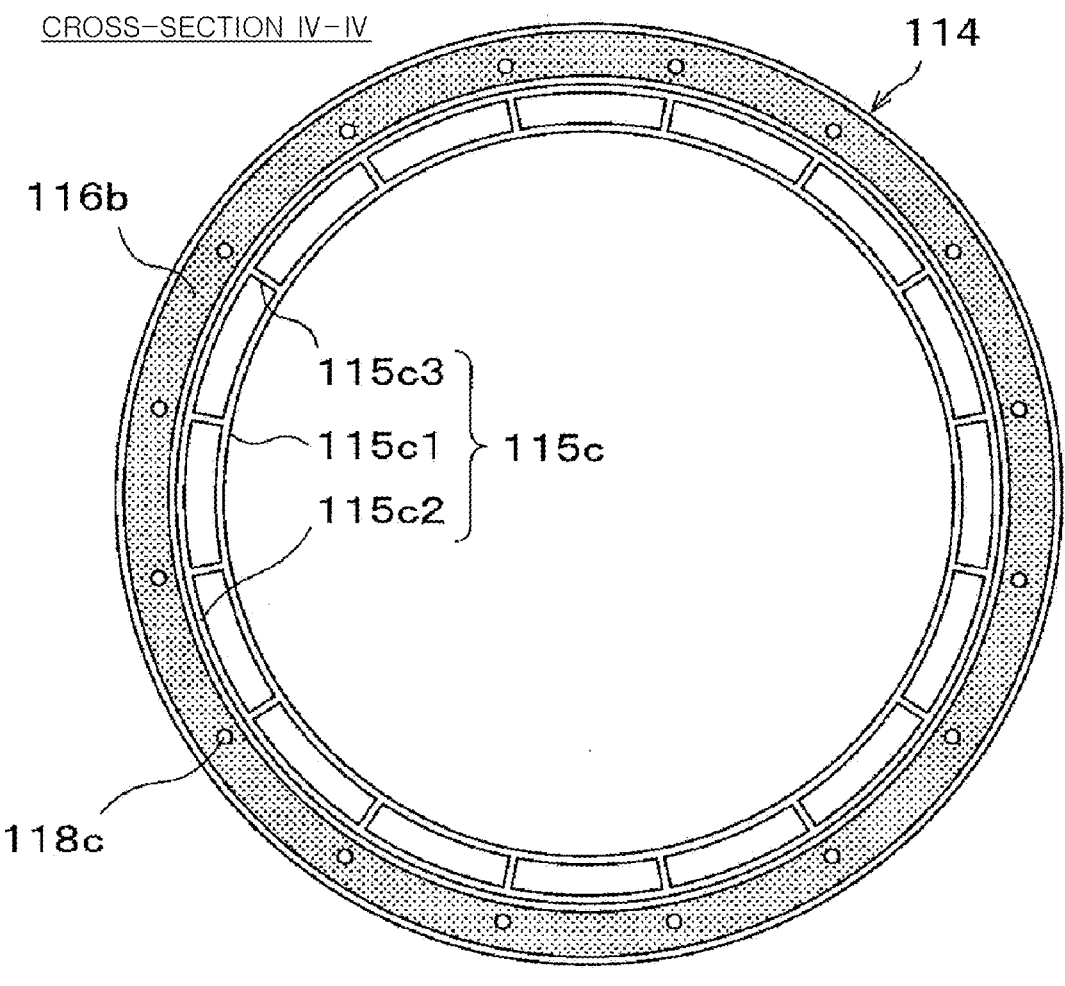
FIG. 4 is a cross-sectional view of an electrostatic chuck illustrating a configuration example of an annular driver for adsorption.
Figure 5:
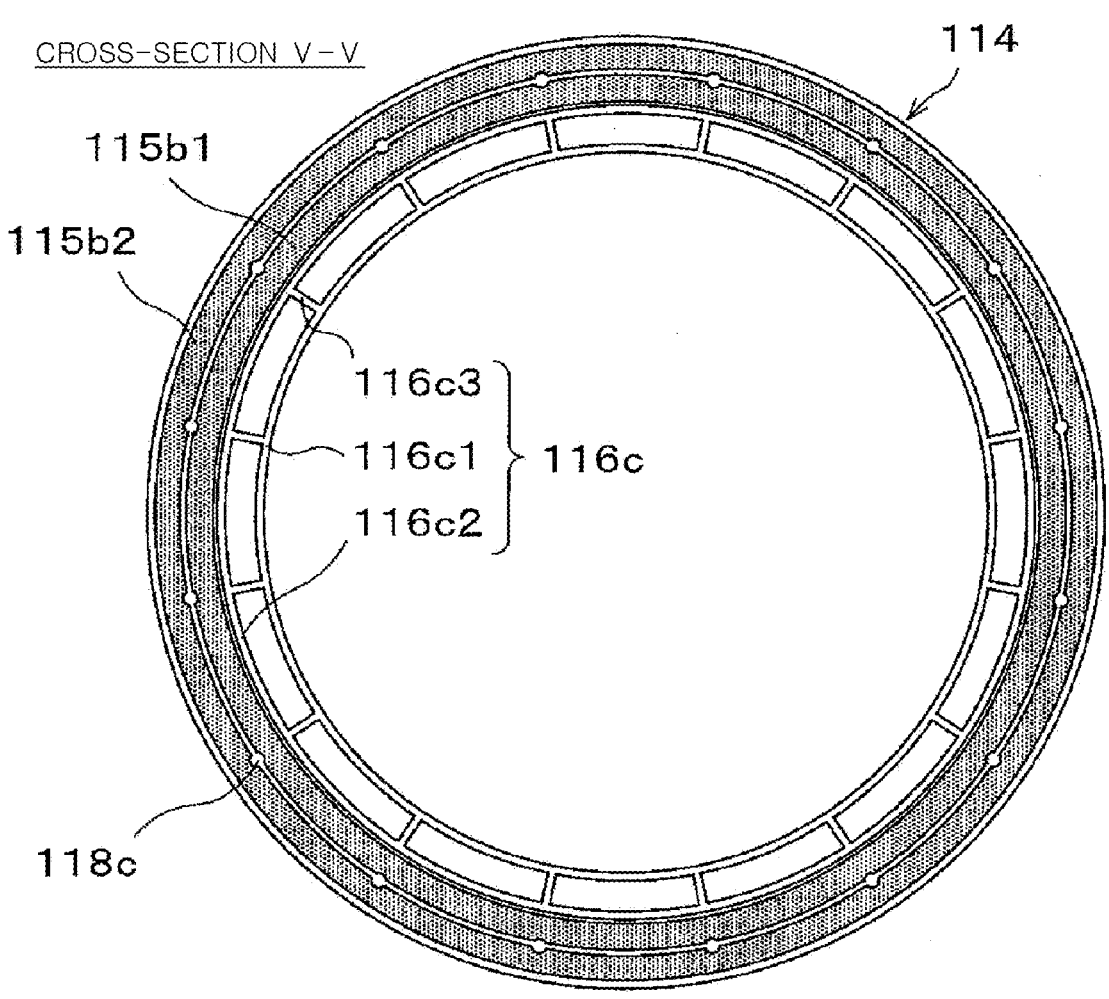
FIG. 5 is a cross-sectional view of an electrostatic chuck illustrating a configuration example of an annular driver for bias.
Figure 7:
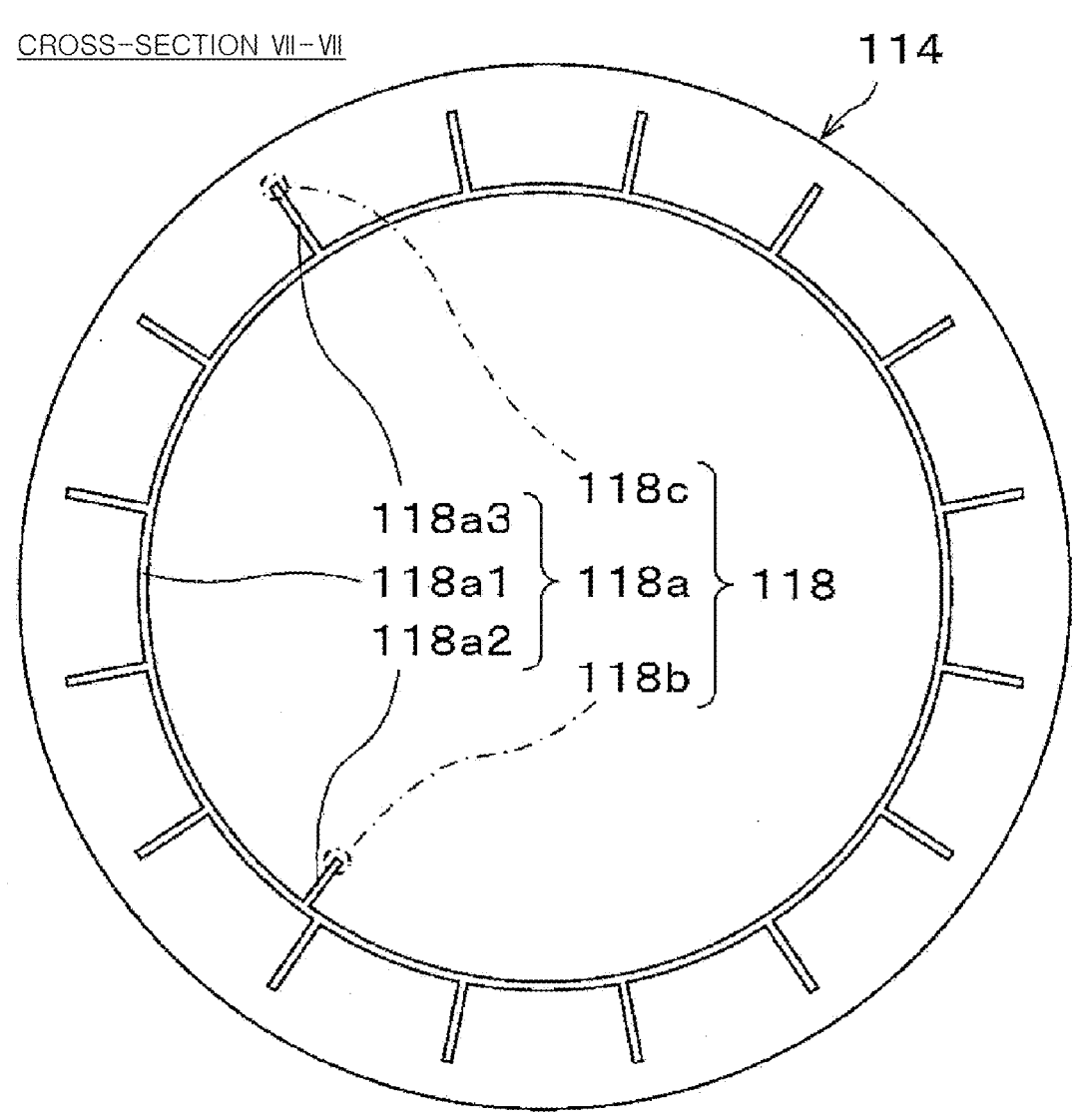
FIG. 7 is a cross-sectional view of an electrostatic chuck illustrating an example of forming a heat transfer gas supply.

FIG. 3 is a cross-sectional view schematically illustrating a configuration of the electrostatic chuck 114. In FIG. 3, an illustration of the base 113 stacked with the electrostatic chuck 114 and the substrate W and the ring assembly 112 supported by the electrostatic chuck 114 is omitted. Also, FIG. 4 is a cross-sectional view taken along line IV-IV shown in FIG. 3. Also, FIG. 5 is a cross-sectional view taken along line V-V shown in FIG. 3. Also, FIG. 7 is a cross-sectional view taken along line VII-VII shown in FIG. 3.

The electrostatic chuck 114 is disposed on the base 113 as described above. The electrostatic chuck 114 includes a ceramic member 114a having at least one ceramic layer. The ceramic member 114a has the central region 111a on an upper surface thereof. In an embodiment, the ceramic member 114a also has the annular region 111b on the upper surface thereof.

Further, the ceramic member 114a has a first thickness in a portion corresponding to the central region 111a and has a second thickness less than the first thickness in a portion corresponding to the annular region 111b. In other words, as shown in FIG. 3, the ceramic member 114a has a substantially convex cross-sectional shape in which a substrate support surface (the central region 111a) is higher than a ring support surface (the annular region 111b) and a convex portion is formed on the upper surface.

The electrostatic electrode 115, the bias electrode 116, and the heater electrode 117 are provided inside the ceramic member 114a of the electrostatic chuck 114. The electrostatic electrode is an example of a clamp electrode. In addition, a distribution space 118a serving as the heat transfer gas supply 118 is formed inside the ceramic member 114a of the electrostatic chuck 114. The electrostatic chuck 114 is configured by placing the electrostatic electrode 115, the bias electrode 116, the heater electrode 117, and the distribution space 118a between the ceramic members 114a (e.g., a pair of dielectric films formed of a nonmagnetic dielectric such as ceramics).

The electrostatic electrode 115 is electrically connected to a DC power source for electrostatic absorption (not shown) through a terminal 1150 provided on a lower surface 114b of the ceramic member 114a. Also, by applying a DC voltage (a DC signal) to the electrostatic electrode 115 from the DC power source for electrostatic adsorption, electrostatic force such as Coulomb force is generated, and the substrate W and the ring assembly 112 are adsorbed to and held in the central region 111a and the annular region 111b by the generated electrostatic force, respectively.

The electrostatic electrode 115 includes a substantially disk-shaped first electrostatic electrode 115a provided inside the convex portion of the ceramic member 114a below the central region 111a and adsorbing and holding the substrate W to the central region 111a. Further, the electrostatic electrode 115 includes a substantially annular second electrostatic electrode 115b provided below the annular region 111b and adsorbing and holding the ring assembly 112 to the annular region 111b.

The first electrostatic electrode 115a is connected to a terminal 1150a via a conductive annular driver for adsorption 115c (a first conductive annular driver). The DC power source for electrostatic adsorption is electrically connected to the terminal 1150a. The annular driver 115c for adsorption is disposed below the annular region 111b in a thickness direction of the ceramic member 114a and is disposed to overlap both the first electrostatic electrode 115a and the annular region 111b in a vertical direction.

As shown in FIG. 4, the annular driver 115c for adsorption includes an inner peripheral portion 115c1 and an outer peripheral portion 115c2 that are two annular members having different diameters, and the inner peripheral portion 115c1 and the outer peripheral portion 115c2 are electrically connected via a plurality of, for example, 13 bridge portions 115c3 in the illustrated example. In addition, the number of bridge portions 115c3 may be arbitrarily changed.

The first electrostatic electrode 115a is electrically connected to the inner peripheral portion 115c1 of the annular driver 115c for adsorption via one or more conductive vias 115d arranged approximately equally in a circumferential direction. The conductive via 115d is disposed to extend downwardly from an edge region E1 of the first electrostatic electrode 115a. Further, the outer peripheral portion 115c2 of the annular driver 115c for adsorption is connected to the terminal 1150a via one or more conductive vias 115e arranged substantially equally in the circumferential direction. In other words, the first electrostatic electrode 115a is connected to the terminal 1150a after being offset outwardly in a radial direction by the annular driver 115c for adsorption inside the ceramic member 114a. The DC power source for electrostatic adsorption is electrically connected to the terminal 1150a.

Figure 6:
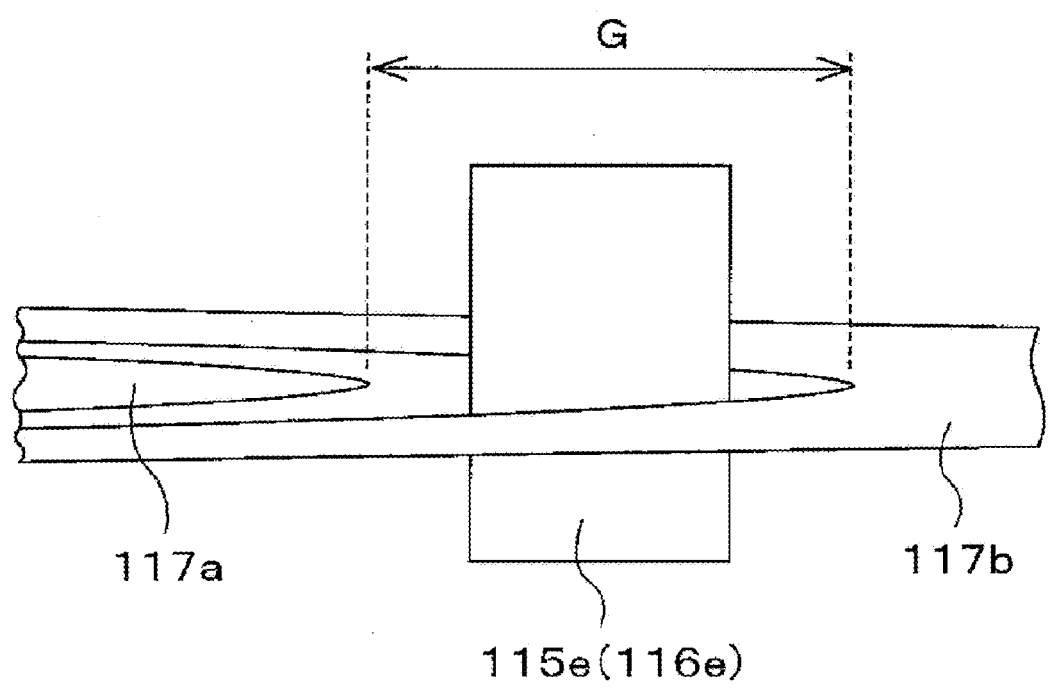
FIG. 6 is an explanatory diagram illustrating a positional relationship between a conductive via and a heater electrode.

Further, as shown in FIGS. 3 and 6, the conductive via 115e passes through a gap G between a first heater electrode group 117a and a second heater electrode 117b to be described below in the radial direction to be connected to the terminal 1150a.

In addition, the annular driver 115c for adsorption does not necessarily have to be configured as a continuous ring as shown in FIG. 4 and may be configured as a ring in which a part thereof is discontinuous. Specifically, the annular driver 115c for adsorption may have, for example, a substantially C-shape in a plan view.

The second electrostatic electrode 115b includes a second electrostatic electrode 115b1 and a second electrostatic electrode 115b2 arranged side by side in the radial direction. The second electrostatic electrode 115b2 is disposed to surround the periphery of the second electrostatic electrode 115b1. Each of the second electrostatic electrode 115b1 and the second electrostatic electrode 115b2 is connected to a terminal 1150b through one or more conductive vias 115f arranged substantially equally in the circumferential direction. A DC power source for electrostatic adsorption (not shown) is electrically connected to the terminal 1150b. As shown in FIG. 3, only one second electrostatic electrode 115b may be disposed below the annular region 111b, or a plurality of second electrostatic electrodes 115b may be disposed in parallel in the radial direction below the annular region 111b, although not shown. When a plurality of second electrostatic electrodes 115b are disposed, a plurality of conductive vias 115f and terminals 1150b corresponding to the number of second electrostatic electrodes 115b are disposed in the ceramic member 114a.

In addition, as the power source for electrostatic absorption, the power source 30 shown in FIG. 2 may be used, or a DC power source for electrostatic absorption (not shown) independent of the power source 30 may be used. In addition, the first electrostatic electrode 115a and the second electrostatic electrode 115b may be connected to independent DC power sources for electrostatic adsorption, respectively, or may be connected to the same DC power source for electrostatic adsorption.

The bias electrode 116 is electrically connected to the power source 30 through the terminal 1160 provided on the lower surface 114b of the ceramic member 114a. The bias electrode 116 functions as a lower electrode, and when a bias RF signal or a bias DC signal is supplied from the power source 30, the bias electrode 116 may generate a bias potential in the substrate W to attract ion components in plasma to the substrate W. In addition, both the conductive member of the base 113 and the bias electrode 116 may function as a lower electrode.

The bias electrode 116 includes a substantially disk-shaped first bias electrode 116a provided inside the convex portion of the ceramic member 114a below the central region 111a and attracting the ion components to the central portion of the substrate W. Further, the bias electrode 116 includes a substantially annular second bias electrode 116b provided below the annular region 111b and attracting ion components mainly to an outer peripheral portion of the substrate W.

The first bias electrode 116a is connected to a terminal 1160a via a conductive annular driver 116c for bias (a second conductive annular driver). The power source 30 is electrically connected to the terminal 1160a. The annular driver 116c for bias is disposed below the annular region 111b in the thickness direction of the ceramic member 114a and is disposed to overlap both the first bias electrode 116a and the annular region 111b in the vertical direction. Further, in an embodiment, the annular driver 116c for bias is disposed between the annular region 111b and the annular driver 115c for adsorption.

As shown in FIG. 5, the annular driver 116c for bias includes an inner peripheral portion 116c1 and an outer peripheral portion 116c2, which are two annular members having different diameters, and the inner peripheral portion 116c1 and the outer peripheral portion 116c2 are electrically connected via a plurality of, for example, 16 bridge portions 116c3 in the illustrated example. In addition, the number of bridge portions 116c3 may be arbitrarily changed.

The first bias electrode 116a is electrically connected to the inner peripheral portion 116c1 of the annular driver 116c for bias through one or more conductive vias 116d arranged approximately equally in the circumferential direction. The conductive via 116d is disposed to extend downwardly from an edge region E2 of the first bias electrode 116a. Further, the outer peripheral portion 116c2 of the annular driver 116c for bias is connected to the terminal 1160a via one or more conductive vias 116e arranged substantially equally in the circumferential direction. In other words, the first bias electrode 116a is connected to the terminal 1160a after being offset outwardly in the radial direction by the annular driver 116c for bias inside the ceramic member 114a.

In addition, as shown in FIGS. 3 and 6, the conductive via 116e passes through a gap G between the first heater electrode group 117a and the second heater electrode 117b, which are described below, in the radial direction, to be connected to the terminal 1160a.

In addition, the annular driver 116c for bias does not necessarily have to be configured as a continuous ring as shown in FIG. 5 and may be configured as a ring in which a part thereof is discontinuous. Specifically, the annular driver 116c for bias may have, for example, a substantially C-shape in a plan view.

Further, a conductive annular driver 116g for coupling is connected to the annular driver 116c for bias via one or more conductive vias 116f arranged substantially equally in the circumferential direction. The conductive via 116f is electrically connected to an inner region 116g1 of the annular driver 116g for coupling. The annular driver 116g for coupling is disposed below the annular driver 116c for bias in the thickness direction of the ceramic member 114a and at least partially overlaps the second bias electrode 116b in the vertical direction. The annular driver 116g for coupling is electrically connected to the second bias electrode 116b by capacitive coupling when attracting the ion component to the substrate W. In addition, an overlap width of the annular driver 116c for bias and the second bias electrode 116b in the radial direction may be appropriately changed according to strength of desired capacitive coupling generated between the second bias electrode 116b and the annular driver 116g for coupling. The strength of the capacitive coupling generated between the second bias electrode 116b and the annular driver 116g for coupling is, for example, 5 nF or less, preferably about 1 nF.

Figure 8:
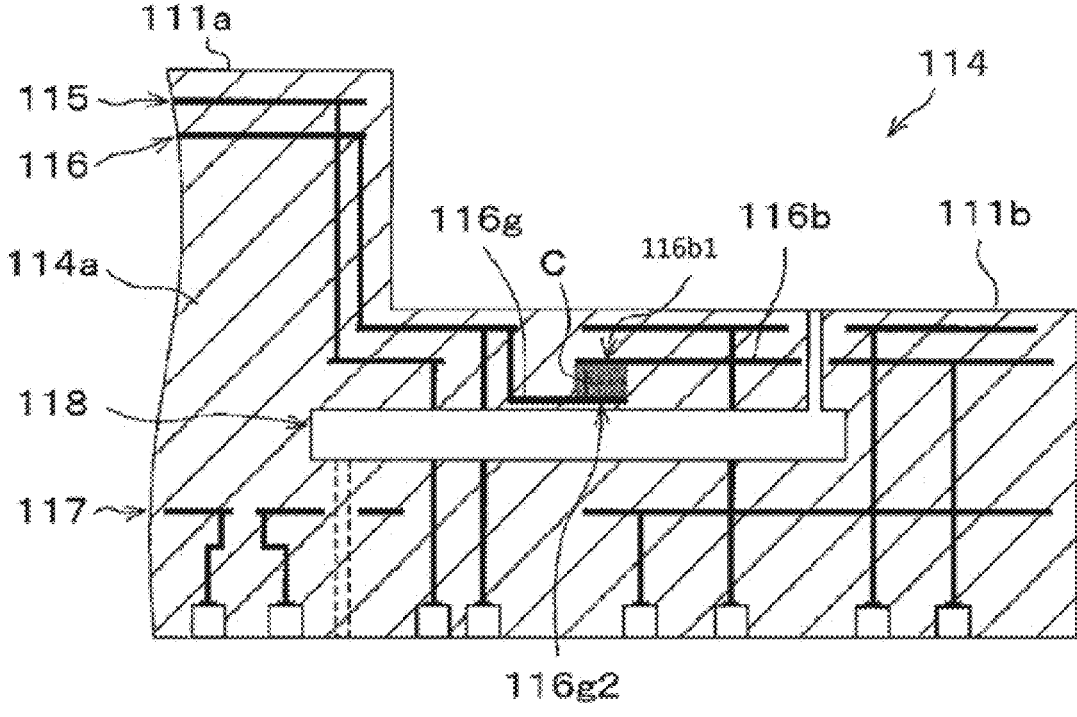
FIG. 8 is an explanatory diagram of a capacitive coupling formed between electrodes.

The second bias electrode 116b is connected to the terminal 1160b via one or more conductive vias 116h arranged substantially equally in the circumferential direction. The conductive via 116h is electrically connected to an outer region 116b2 of the second bias electrode 116b. The power source 30 is electrically connected to the terminal 1160b. An inner region 116b1 of the second bias electrode 116b is electrically connected to the outer region 116g2 (the first bias electrode 116a) of the annular driver 116g for coupling by capacitive coupling C as shown in FIG. 8 in attracting the ion component to the substrate W described above.

In addition, the first bias electrode 116a and the second bias electrode 116b may be independently connected to the second RF generator 31b and/or the first DC generator 32a of the power source 30, respectively, or may be integrally connected to the second RF generator 31b and/or the first DC generator 32a. In other words, the power source 30 may include a plurality of second RF generators 31b and/or first DC generators 32a independently connected to the first bias electrode 116a and the second bias electrode 116b, respectively.

The heater electrode 117 is electrically connected to a heater power source 1171 (refer to FIG. 2) through a terminal 1170 provided on the lower surface 114b of the ceramic member 114a. Further, on a feed cable connecting the heater electrode 117 and the heater power source 1171, a cut filter 1172 (a high frequency cut filter) for attenuating or blocking high frequency power (RF power or DC pulse signal) as a noise component penetrating into the corresponding feed cable from the electrostatic electrode 115 or the bias electrode 116 is provided between the heater electrode 117 and a ground potential. In addition, the heater electrode 117 is heated by applying a voltage from the heater power source 1171 and adjusts at least one of the electrostatic chuck 114, the ring assembly 112, and the substrate W to a target temperature.

The heater electrode 117 includes a substantially disk-shaped first heater electrode group provided below the central region 111a and heating the substrate W supported by the central region 111a. In addition, the heater electrode 117 includes a plurality of annular second heater electrodes 117b provided below the annular region 111b and heating the ring assembly 112 supported by the annular region 111b.

The first heater electrode group 117a is configured in a substantially disk shape having a larger diameter than the convex portion of the ceramic member 114a. The first heater electrode group 117a includes a plurality of first heater electrodes (not shown). Each of the plurality of first heater electrodes is connected to a terminal 1170a through an independent conductive via 117c, and the heater power source 1171a is electrically connected to the terminal 1170a. Thereby, supply of electric power to each of the plurality of first heater electrodes may be individually controlled. In other words, in the first heater electrode group 117a, a temperature of the central region 111a (the substrate W) is independently controlled for each of a plurality of temperature control regions defined by each or a combination of the plurality of first heater electrodes in a plan view.

The second heater electrode 117*b* is configured to adjust the temperature of the annular region 111*b*, thereby adjusting the temperature of the ring assembly 112 supported by the corresponding annular region 111*b*. The second heater electrode 117*b* is connected to the terminal 1170*b* via one or more conductive vias 117*d*. The heater power source 1171*b* is electrically connected to the terminal 1170*b*. In addition, like the first heater electrode group 117*a*, the second heater electrode 117*b* may be configured such that a temperature may be adjusted independently for each of a plurality of temperature adjustment regions in a plan view.

In addition, as the heater power source, the power source 30 shown in FIG. 2 may be used, or a heater power source (not shown) independent of the power source 30 may also be used.

Here, a substantially annular gap (the gap G, refer to FIG. 6) is formed between the first heater electrode group 117*a* having a substantially disk-like shape and the second heater electrode 117*b* having a substantially annular shape. Also, as described above, the conductive via 115*e* and the conductive via 116*e* are respectively connected to the terminal 1150 and the terminal 1160 through the corresponding gap G as shown in FIG. 6.

The heat transfer gas supply 118 includes a distribution space 118*a*, a gas inlet 118*b* for supplying a heat transfer gas to the distribution space 118*a*, and a gas outlet 118*c* for discharging the heat transfer gas from the distribution space 118*a*. The heat transfer gas supply 118 sequentially passes through the gas inlet 118*b*, the distribution space 118*a*, and the gas outlet 118*c* to supply a heat transfer gas (a back side gas, e.g., He gas) between a back surface of the ring assembly 112 and the annular region 111*b*.

As shown in FIG. 3, the distribution space 118*a* is formed between the annular driver 115*c* for adsorption and the first heater electrode group 117*a* and between the annular driver 116*c* for bias and the first heater electrode group 117*a* in the thickness direction of the ceramic member 114*a*. Further, as shown in FIG. 7, the distribution space 118*a* has an annular portion 118*a*1 formed in a substantially annular shape in a plan view, an inner peripheral protruding portion 118*a*2 formed to protrude radially inwardly from the annular portion 118*a*1, and a plurality of outer peripheral protruding portions 118*a*3 formed to protrude radially outwardly from the annular portion 118*a*1.

The annular portion 118*a*1 is formed in an annular shape along the circumferential direction of the ceramic member 114*a*. In the radial direction of the ceramic member 114*a*, the annular portion 118*a*1 is formed to have a width covering a portion in which at least the annular driver 115*c* for adsorption and/or the annular driver 116*c* for bias and the first heater electrode group 117*a* overlap in the vertical direction.

As shown in FIG. 7, the inner peripheral protruding portion 118*a*2 is formed to protrude from the radially inner side of the annular portion 118*a*1 and is connected to the gas inlet 118*b* (refer to FIG. 3) formed to extend from the lower surface 114*b* of the ceramic member 114*a*. The gas inlet 118*b* is connected to a heat transfer gas source (not shown).

As shown in FIG. 7, the outer peripheral protruding portion 118*a*3 is formed to protrude from the radially outer side of the annular portion 118*a*1 and is formed to the gas outlet 118*c* (refer to FIG. 3) formed to extend from the upper surface (the ring support surface) of the ceramic member 114*a*. A plurality of gas outlets 118*c* (16 gas outlets in the illustrated example) are arranged substantially equally in the circumferential direction of the annular region 111*b* (the ring support surface), and the outer peripheral protruding portion 118*a*3 is provided in plurality (16 outer peripheral protruding portions in the illustrated example) to correspond to the number of the gas outlets 118*c*.

In addition, the heat transfer gas supply 118 may be configured to be able to supply a heat transfer gas between the back side of the substrate W and the central region 111*a*. At this time, as the heat transfer gas supplied to the back side of the substrate W, even if the heat transfer gas supplied to the back side of the ring assembly 112 is used, that is, another gas outlet extending from the central region 111*a* (the substrate support surface) may be further connected to the annular portion 118*a*1. Alternatively, another heat transfer gas supply may be disposed independently of the distribution space 118*a*, the gas inlet 118*b*, and the gas outlet 118*c* for supplying the heat transfer gas to the back side of the ring assembly 112.

In an embodiment, the substrate support 11 includes first and second central electrodes 115*a* and 116*a*, the first to fourth vertical connectors 115*d*, 116*d*, 115*e*, and 116*e*, the first and second annular connectors 115*c* and 116*c*, and a central heater electrode 117*a*. These are inserted (embedded) into the ceramic member 114*a*. The first central electrode 115*a* is disposed below the substrate support surface 111*a*. The second central electrode 116*a* is disposed below the first central electrode 115*a*. In an embodiment, the first central electrode 115*a* is an electrostatic electrode, and the second central electrode 116*a* is a bias electrode. One or more first vertical connectors 115*d* extend downwardly from the edge region E1 of the first central electrode 115*a*. The first annular connector 115*c* extends outwardly from one or more first vertical connectors 115*d* in a horizontal direction. An inner region 115*c*1 of the first annular connector 115*c* is disposed below the edge region E1 of the first central electrode 115*a* and electrically connected to the edge region E1 of the first central electrode 115*a* through one or more first vertical connectors 115*d*. One or more second vertical connectors 116*d* extend downwardly from the edge region E2 of the second central electrode 116*a*. The second annular connector 116*c* extends outwardly from one or more second vertical connectors 116*d* in the horizontal direction. The inner region 116*c*1 of the second annular connector 116*c* is disposed below the edge region E2 of the second central electrode 116*a* and is electrically connected to the edge region E2 of the second central electrode 116*a* through the second vertical connector 116*d*. In addition, the vertical connector is a connector extending in the vertical direction, and is also called a via connector. Also, the annular connector is a connector extending in the horizontal direction, and is also called an offset connector. The vertical connector and the annular connector are formed of a conductive material. The central heater electrode 117*a* has one or more divided regions. The one or more divided regions have tens to hundreds of divided regions in the horizontal direction in order to individually perform temperature control for each zone with respect to the substrate on the substrate support surface 111*a*.

In an embodiment, the ceramic member 114*a* has at least one gas inlet 118*b*, a plurality of gas outlets 118*c*, and a gas distribution space 118. At least one gas inlet 118*b* extends from the lower surface 114*b* of the ceramic member 114*a* to the gas distribution space 118. The plurality of gas outlets 118*c* extend from the gas distribution space 118 to the substrate support surface 111*a* or the ring support surface 111*b*. In an embodiment, a portion or the entirety of the gas distribution space 118 is disposed between the first annular connector 115*c* and the central heater electrode 117*a* and also between the second annular connector 116*c* and the central heater electrode 117*a*.

In an embodiment, the third vertical connector 115*e* extends downwardly from the outer region 115*c*2 of the first annular connector 115*c*. In an embodiment, the fourth vertical connector 116*e* extends downwardly from the outer region 116*c*2 of the second annular connector 116*c*. In an embodiment, the DC power source is electrically connected to the outer region 115*c*2 of the first annular connector 115*c* via the third vertical connector 115*e* and is configured to generate a DC signal. In an embodiment, a voltage pulse generator is electrically connected to the outer region 116*c*2 of the second annular connector 116*c* via the fourth vertical connector 116*e* and is configured to generate a sequence of voltage pulses. In an embodiment, the second annular connector 116*c* is disposed above the first annular connector 115*c*. In an embodiment, the first annular connector 115*c* has an outer diameter larger than an outer diameter of the first central electrode 115*a*. In an embodiment, the second annular connector 116*c* has an outer diameter greater than an outer diameter of the second central electrode 116*a*. In an embodiment, the RF power source 31*b* is electrically connected to the base 113 or the second annular connector 116*c* and is configured to generate an RF signal. In an embodiment, the central heater electrode 117*a* is connected to a ground potential via an RF filter.

In an embodiment, the substrate support 11 includes a third annular connector 116*g* and a first annular electrode 116*b*. These are inserted into the ceramic member 114*a*. The inner region 116*g*1 of the third annular connector 116*g* is disposed below the outer region 116*c*2 of the second annular connector 116*c* and is electrically connected to the outer region 116*c*2 of the second annular connector 116*c* via the fifth vertical connector 116*f*. The first annular electrode 116*b* is disposed below the ring support surface 111*b*. A capacitive coupling C is formed between the inner region 116*b*1 of the first annular electrode 116*b* and the outer region 116*g*2 of the third annular connector 116*g* (refer to FIG. 8). In an embodiment, the inner region 116*b*1 of the first annular electrode 116*b* is disposed above the outer region 116*g*2 of the third annular connector 116*g*. In addition, the inner region 116*b*1 of the first annular electrode 116*b* may be disposed below the outer region 116*g*2 of the third annular connector 116*g*. In an embodiment, the capacitive coupling C has a capacity of 5 nF or less. In an embodiment, an additional voltage pulse generator is electrically connected to the outer region 116*b*2 of the first annular electrode 116*b* through the sixth vertical connector 116*h* and is configured to generate a sequence of additional voltage pulses.

In an embodiment, the substrate support 11 includes at least one second annular electrode 115*b*1 and 115*b*2 inserted into the ceramic member 114*a* and disposed between the ring support surface 111*b* and the first annular electrode 116*b*. In an embodiment, the at least one additional DC power source is electrically connected to the at least one second annular electrode 115*b*1 and 115*b*2 via the at least one seventh vertical connector 115*f* and is configured to generate at least one additional DC signal. In an embodiment, the first annular electrode 116*b* is an annular bias electrode, and at least one second annular electrode 115*b*1 and 115*b*2 is an annular electrostatic electrode.

In an embodiment, the substrate support 11 includes the annular heater electrode 117*b* inserted into the ceramic member 114*a* and disposed below the ring support surface 111*b* to surround the central heater electrode 117*a*. In an embodiment, an annular gap G is formed between the central heater electrode 117*a* and the annular heater electrode 117*b*.

In an embodiment, the third vertical connector 115*e* and the fourth vertical connector 116*e* extend vertically through the annular gap G.

In an embodiment, the substrate support 11 includes the central electrode 116*a*, the first and second annular connectors 116*c* and 116*g*, and the annular electrode 116*b*. These are inserted into the ceramic member 114*a*. The central electrode 116*a* is disposed below the substrate support surface 111*a*. The inner region 116*c*1 of the first annular connector 116*c* is disposed below the edge region E2 of the central electrode 116*a* and is electrically connected to the edge region E2 of the central electrode 116*a* through the first vertical connector 116*d*. The inner region 116*g*1 of the second annular connector 116*g* is disposed below the outer region 116*c*2 of the first annular connector 116*c* and is electrically connected to the outer region 116*c*2 of the first annular connector 116*c* through the second vertical connector 116*f*. The annular electrode 116*b* is disposed below the ring support surface 111*b*. The capacitive coupling C is formed between the inner region 116*b*1 of the annular electrode 116*b* and the outer region 116*g*2 of the second annular connector 116*g*. Also, the first voltage pulse generator is electrically connected to the outer region 116*c*2 of the first annular connector 116*c* via the third vertical connector 116*e* and is configured to generate a sequence of first voltage pulses. Further, the second voltage pulse generator is electrically connected to the outer region 116*b*2 of the annular electrode 116*b* through the fourth vertical connector 116*h* and is configured to generate a sequence of second voltage pulses.

In an embodiment, the substrate support 11 includes the central electrode 116*a*, the annular connector 116*c*, and the central heater electrode 117*a*. These are inserted into the ceramic member 114*a*. The central electrode 116*a* is disposed below the substrate support surface 111*a*. The inner region 116*c*1 of the annular connector 116*c* is disposed below the edge region E2 of the central electrode 116*a* and is electrically connected to the edge region E2 of the central electrode 116*a* via the first vertical connector 116*d*. A portion or the entirety of the gas distribution space 118 is formed between the annular connector 116*c* and the central heater electrode 117*a*. Further, the power source is electrically connected to the outer region of the annular connector 116*c* via the second vertical connector 116*e* and is configured to generate a DC signal or an RF signal.

In an embodiment, the substrate support 11 includes the first and second central electrodes 115*a* and 116*a*, the first and second annular connectors 115*c* and 116*c*, the central heater electrode 117*a*, and the annular heater electrode 117*b*. These are inserted into the ceramic member 114*a*. The first central electrode 115*a* is disposed under the substrate support surface 111*a*, and the second central electrode 116*a* is disposed below the first central electrode 115*a*. The inner region 115*c*1 of the first annular connector 115*c* is disposed below the edge region E1 of the first central electrode 115*a* and is electrically connected to the edge region E1 of the first central electrode 115*a* through the first vertical connector 115*d*. The inner region 116*c*1 of the second annular connector 116*c* is disposed below the edge region E2 of the second central electrode 116*a* and is electrically connected to the edge region E2 of the second central electrode 116*a* through the second vertical connector 116*d*. An annular gap G is formed between the central heater electrode 117*a* and the annular heater electrode 117*b*. In an embodiment, the DC power source is electrically connected to the outer region 115*c*2 of the first annular connector 115*c* via the third vertical connector 115*e* extending vertically through the annular gap G and is configured to generate a DC signal. In an embodiment, the voltage pulse generator is electrically connected to the outer region 116c2 of the second annular connector 116c via the fourth vertical connector 116e extending vertically through the annular gap G and is configured to generate a sequence of voltage pulses.

In the above, various exemplary embodiments have been described, but the present disclosure is not limited to the aforementioned embodiments, and various additions, omissions, substitutions, and changes may be made. Further, it is possible to form another embodiment by combining the elements in another embodiment.

For example, in the example shown in FIG. 3, the annular driver 115c for adsorption and the annular driver 115c for bias are arranged in this order from the bottom in the thickness direction of the ceramic member 114a, the annular driver 116c for bias may be disposed below the annular driver 115c for adsorption. Similarly, in the example shown in FIG. 3, the annular driver 116g for coupling is disposed below the annular driver 116c for bias, but the annular driver 116g for coupling may be disposed above the annular driver 116c for bias. Further, the second bias electrode 116b may be disposed below the annular driver 116g for coupling.

For example, in the above embodiment, the case in which the heater electrode 117 includes the first heater electrode group 117a for heating the substrate W and the second heater electrode 117b for heating the ring assembly 112 is described as an example. However, when the temperature control of the ring assembly 112 is not required, the annular second heater electrode 117b may be omitted appropriately. In this case, it is preferable that the conductive vias 115e and the conductive vias 116e pass through the radially outer side of the at least the first heater electrode group 117a to be connected to the terminals 1150 and 1160, respectively.

<Operational Effect 1 of Plasma Processing Apparatus According to Present Disclosure>

Here, as described above, in the electrostatic chuck of the related art in which the distribution space 118a, as the heat transfer gas supply 118, is not formed, the electrode portion (corresponding to the electrostatic electrode 115 and the bias electrode 116) and the heating device (corresponding to the heater electrode 117) may be capacitively coupled during plasma processing and a portion of adsorption power or bias power may leak to the heating device as a noise component. The noise component penetrating into the heating device may be normally removed generally by an RF cut filter (corresponding to the cut filter 1172), but when a voltage pulse based on DC is used as adsorption power or bias power, the noise component may not be appropriately removed or a plasma processing may not be executed on the substrate W appropriately.

Capacitance between the electrode portion and the heating device is expressed by Equation (1) below:

$$\text{Capacitance } C \text{ [F]} = \text{permittivity } \varepsilon \text{ [F/m]} \times \text{area } S \text{ [m}^2\text{]}/\text{distance } d \text{ [m]} \quad (1)$$

In consideration of Equation (1), in the related art, by increasing the distance between the electrode portion and the heating device or changing the material (dielectric constant) of the electrostatic chuck, capacitance is decreased and the noise component leaking from the electrode portion to the heating device is reduced. However, due to the recent demand for miniaturization of the plasma processing chamber, the thickness of the electrostatic chuck is limited, it is difficult to increase the distance between the electrode portion and the heating device, and it is also difficult to develop a new electrostatic chuck material early.

In this regard, in the electrostatic chuck 114 provided in the plasma processing apparatus 1 according to the present embodiment, as shown in FIG. 3, the distribution space 118a to which a heat transfer gas (He gas) as a backside gas is supplied is formed between the annular driver 115c for adsorption and the first heater electrode group 117a and also between the annular driver 116c for bias and the first heater electrode group 117a. Further, the distribution space 118a is formed to have a width at least covering a portion in which the annular driver 115c for adsorption and/or the annular driver 116c for bias and the first heater electrode group 117a overlap in the vertical direction.

A ratio of the permittivity $\varepsilon$ of the ceramic member 114a constituting the electrostatic chuck 114 to the He gas as a heat transfer gas supplied to the distribution space 118a is approximately, He gas:ceramic member 114a=1:10. Considering the above equation (1), the distribution space 118a formed between the annular driver 115c for adsorption and/or the annular driver 116c for bias and the first heater electrode group 117a has the effect equivalent to multiplying the distance d by 10 times. This effect is equally obtained even when the distribution space 118a is filled with He gas or when the distribution space is not filled with the He gas, that is, when the distribution space 118a is in a vacuum.

Further, the present inventors intensively studied and found that, as shown in FIG. 3, by forming the distribution space 118a inside the electrostatic chuck 114, the capacitance can be increased by about $\frac{1}{15}$, that is, the impedance may be increased by 15 times. Also, the present inventors discovered a possibility of appropriately adjusting the value of the capacitance by changing the type of the heat transfer gas supplied to the distribution space 118a or a height (a size of the distribution space 118a with respect to a thickness direction of the electrostatic chuck 114) of the distribution space 118a.

As described above, in the plasma processing apparatus 1 according to the present embodiment, a heat transfer gas is supplied by forming the distribution space 118a in the electrostatic chuck 114, whereby capacitive coupling between the electrode portion (the electrostatic electrode 115) and the bias electrode 116 and the heating device (the first heater electrode group 117a) may be weakened, thereby appropriately suppressing or preventing the penetration of noise components into the heating device.

Also, by increasing the efficiency of supply of adsorption power to the electrostatic electrode 115 and supply of the bias power to the bias electrode 116, the plasma processing may be appropriately performed on the substrate W.

In addition, since the penetration of noise components into the cut filter 1172 is suppressed or prevented, the occurrence of defects or damage to the corresponding cut filter 1172 may be suppressed and time or running cost required for the maintenance of the plasma processing apparatus 1 may be reduced.

According to the present embodiment, as the heat transfer gas supplied to the distribution space 118a, He gas, which has been conventionally used as a backside gas in plasma processing, may be utilized. That is, it is not necessary to prepare a new heat transfer gas. For this reason, the technique according to the present disclosure may be easily applied to the plasma processing apparatus 1 by simply introducing the electrostatic chuck 114 in which the distribution space 118a is formed.

In addition, in the above embodiment, the distribution space 118a is connected to the gas outlet 118c extending from the annular region 111b, but instead of or in addition to this, the distribution space 118a may be connected to another gas outlet (not shown) extending from the central region 111a. In other words, the backside gas supplied through the distribution space 118a may be supplied to the back surface of the substrate W in place of or in addition to the lower surface of the ring assembly 112.

<Operational Effect 2 of Plasma Processing Apparatus According to Present Disclosure>

In order to uniformly control a process result of the plasma processing with respect to the substrate W in-plane, it is important to uniformly control an in-plane temperature of the substrate W in plasma processing. Here, as described above, the first heater electrode group 117a has a larger diameter than the convex portion of the ceramic member 114a. For this reason, when the conductive vias 115e and the conductive vias 116e extend directly from the outer ends of the electrostatic electrode 115 and the bias electrode 116 and are connected to the terminals, respectively, it is necessary to form a hole, through which these conductive vias are inserted, for the first heater electrode group 117a. However, if a hole is formed in the first heater electrode group 117a in this manner, the central region 111a (the substrate W) may not be directly heated in a portion in which the corresponding hole is formed and the in-plane temperature of the substrate W may not be uniform.

In this regard, in the electrostatic chuck 114 included in the plasma processing apparatus 1 according to the present embodiment, the electrostatic electrode 115 and the bias electrode 116 are connected to the terminals through the annular driver 115c for adsorption and the annular driver 116c for bias, respectively. More specifically, after being offset to a radial position corresponding to the gap G between the first heater electrode group 117a and the second heater electrode 117b by the annular driver 115c for adsorption and the annular driver 116c for bias, a conductive via is disposed to extend toward the terminal in the corresponding offset position.

Thereby, since the conductive via is connected to the terminal through the gap G between the first heater electrode group 117a and the second heater electrode 117b, there is no need to form a hole in the first heater electrode group 117a. That is, the central region 111a (the substrate W) may be appropriately heated on the entire surface of the first heater electrode group 117a, and non-uniformity of the in-plane temperature of the substrate W during plasma processing may be appropriately suppressed.

Further, according to the present embodiment, by disposing the electrostatic electrode 115 and the bias electrode 116 in the vicinity of the annular region 111b in the thickness direction of the electrostatic chuck 114, the distance d between the corresponding electrostatic electrode 115 and the bias electrode 116 and the first heater electrode group 117a may be easily increased. In addition, by increasing the distance d in this manner, the capacitance between the annular driver 115c for adsorption, the annular driver 116c for bias, and the first heater electrode group 117a may be appropriately reduced and formation delay of the heat transfer gas distribution space 118a may be appropriately enlarged. In other words, the capacitive coupling between the electrode portion (the electrostatic electrode 115 and the bias electrode 116) and the heating device (the first heater electrode group 117a) may be appropriately reduced.

<Operational Effect 3 of Plasma Processing Apparatus According to Present Disclosure>

In a plasma processing apparatus, when an etching process for transferring a mask pattern is performed on an etching target layer formed to be stacked on the surface of the substrate W, it is important to precisely control the angle of incidence (movement of electrons) of the ion component on the substrate W and the like. However, in the case of independently controlling the supply of bias power to the first bias electrode 116a and the second bias electrode 116b for attracting ion components to the substrate W, an error may occur in the actually supplied electric power due to the influence of a machine difference etc. to degrade the precision of the etching process, even when the same supply electric power is supplied to the first bias electrode 116a and the second bias electrode 116b.

In this regard, in the electrostatic chuck 114 according to the present embodiment, the annular driver 116g for coupling electrically connected to the second bias electrode 116b by the annular driver 116c for bias is disposed to at least partially overlap the second bias electrode 116b in the vertical direction.

Thereby, the annular driver 116g for coupling is electrically connected to the second bias electrode 116b by capacitive coupling when attracting the ion component to the substrate W. In other words, even when the first bias electrode 116a and the second bias electrode 116b are electrically connected and electric power is independently supplied to the first bias electrode 116a and the second bias electrode 116b, the attracting of ions to the central portion and outer peripheral portion of the substrate W may be synchronized. Also, as the present inventors intensively studied and discovered that the roundness of a shape of an etching hole formed on the surface of the substrate W may be appropriately improved by synchronizing the amount of attracting ions and the movement of electrons to the central portion and the outer peripheral portion of the substrate W with respect to the substrate W.

The disclosed embodiment is to be considered as illustrative and not restrictive in all respects. The above embodiment may be omitted, substituted, and changed in various forms, without deviating from the attached claims and the gist of the invention.

The invention claimed is:

1. A plasma processing apparatus comprising:
   a plasma processing chamber;
   a substrate support disposed in the plasma processing chamber, the substrate support including:
      a base,
      a ceramic member disposed on the base and having a substrate support surface and a ring support surface, the ceramic member including a gas distribution space, at least one gas inlet extending from a lower surface of the ceramic member to the gas distribution space and a plurality of gas outlets extending from the gas distribution space to the substrate support surface or the ring support surface,
      one or more annular members disposed on the ring support surface to surround the substrate on the substrate support surface,
      first and second central electrodes embedded into the ceramic member, the first central electrode being disposed below the substrate support surface, the second central electrode being disposed below the first central electrode,
      first to fourth vertical connectors embedded into the ceramic member and extending in a vertical direction,
      first and second annular connectors embedded into the ceramic member and extending in a horizontal direction, an inner region of the first annular connector being disposed below an edge region of the first central electrode and electrically connected to the edge region of the first central electrode through the first vertical connector, an inner region of the second annular connector being disposed below an edge region of the second central electrode and electrically connected to the edge region of the second central electrode through the second vertical connector, and a central heater electrode embedded into the ceramic member and having one or more divided regions, a portion or the entirety of the gas distribution space being formed between the first annular connector and the central heater electrode and further formed between the second annular connector and the central heater electrode;

a DC power source electrically connected to an outer region of the first annular connector through the third vertical connector and configured to generate a DC signal; and a voltage pulse generator electrically connected to an outer region of the second annular connector through the fourth vertical connector and configured to generate a sequence of voltage pulses.

2. The plasma processing apparatus of claim 1, wherein the second annular connector is disposed above the first annular connector.

3. The plasma processing apparatus of claim 1, wherein the first annular connector extends outwardly from the first vertical connector.

4. The plasma processing apparatus of claim 1, wherein the second annular connector extends outwardly from the second vertical connector.

5. The plasma processing apparatus of claim 1, further comprising:

an RF power source electrically connected to the base or to the second annular connector and configured to generate an RF signal.

6. The plasma processing apparatus of claim 1, wherein the central heater electrode is connected to a ground potential through an RF filter.

7. The plasma processing apparatus of claim 1, wherein the substrate support further includes:

a fifth vertical connector embedded into the ceramic member and extending in a vertical direction;

a third annular connector embedded into the ceramic member and extending in a horizontal direction; and a first annular electrode embedded into the ceramic member and disposed below the ring support surface, wherein an inner region of the third annular connector is disposed below the outer region of the second annular connector and is electrically connected to the outer region of the second annular connector through the fifth vertical connector, and capacitive coupling is formed between the inner region of the first annular electrode and an outer region of the third annular connector.

8. The plasma processing apparatus of claim 7, wherein the capacitive coupling has a capacity of 5 nF or less.

9. The plasma processing apparatus of claim 7, further comprising:

an additional voltage pulse generator electrically connected to the outer region of the first annular electrode and configured to generate a sequence of additional voltage pulses.

10. The plasma processing apparatus of claim 7, further comprising:

at least one additional DC power source configured to generate at least one additional DC signal, wherein the substrate support further includes at least one second annular electrode embedded into the ceramic member and electrically connected to the at least one additional DC power source, and the at least one second annular electrode is disposed between the ring support surface and the first annular electrode.

11. The plasma processing apparatus of claim 10, wherein the substrate support further includes an annular heater electrode embedded into the ceramic member and disposed below the ring support surface to surround the central heater electrode, an annular gap is formed between the central heater electrode and the annular heater electrode, and the third vertical connector and the fourth vertical connector extend in a vertical direction through the annular gap.

12. A plasma processing apparatus comprising:

a plasma processing chamber;

a substrate support disposed in the plasma processing chamber, the substrate support including:

a base, a ceramic member disposed on the base and having a substrate support surface and a ring support surface, one or more annular members disposed on the ring support surface to surround the substrate on the substrate support surface, a central electrode embedded into the ceramic member and extending in a horizontal direction below the substrate support surface, first to fourth vertical connectors embedded into the ceramic member and extending in a vertical direction, first and second annular connectors embedded into the ceramic member and extending in the horizontal direction, an inner region of the first annular connector being disposed below an edge region of the central electrode and electrically connected to the edge region of the central electrode through the first vertical connector, an inner region of the second annular connector being disposed below an outer region of the first annular connector and electrically connected to the outer region of the first annular connector through the second vertical connector, and an annular electrode embedded into the ceramic member and disposed below the ring support surface, capacitive coupling being formed between an inner region of the annular electrode and an outer region of the second annular connector;

a first voltage pulse generator electrically connected to the outer region of the first annular connector through the third vertical connector and configured to generate a sequence of first voltage pulses; and a second voltage pulse generator electrically connected to an outer region of the annular electrode through the fourth vertical connector and configured to generate a sequence of second voltage pulses.

13. The plasma processing apparatus of claim 12, wherein the capacitive coupling has a capacity of 5 nF or less.

14. The plasma processing apparatus of claim 12, wherein the substrate support further includes a central electrostatic electrode and an annular electrostatic electrode embedded into the ceramic member, the central electrostatic electrode is disposed between the substrate support surface and the central electrode, and the annular electrostatic electrode is disposed between the ring support surface and the annular electrode.

15. A plasma processing apparatus comprising:

a plasma processing chamber;

a substrate support disposed in the plasma processing chamber, the substrate support including:

a base, a ceramic member disposed on the base and having a substrate support surface and a ring support surface, the ceramic member including a gas distribution space, at least one gas inlet extending from a lower surface of the ceramic member to the gas distribution space and a plurality of gas outlets extending from the gas distribution space to the substrate support surface or the ring support surface, one or more annular members disposed on the ring support surface to surround the substrate on the substrate support surface, an electrode embedded into the ceramic member and disposed below the substrate support surface, first to third vertical connectors embedded into the ceramic member and extending in a vertical direction, first and second annular connectors embedded into the ceramic member and extending in a horizontal direction, an inner region of the first annular connector being disposed below an edge region of the electrode and electrically connected to the edge region of the electrode through the first vertical connector, an inner region of the second annular connector being disposed below an outer region of the first annular connector and electrically connected to the outer region of the first annular connector through the second vertical connector, and a heater electrode embedded into the ceramic member and having one or more divided regions, a portion or the entirety of the gas distribution space being formed between the annular connector and the heater electrode; and a power source electrically connected to an outer region of the first annular connector or the second annular connector through the third vertical connector and configured to generate a DC signal or an RF signal.

16. A plasma processing apparatus comprising:

a plasma processing chamber;

a substrate support disposed in the plasma processing chamber, the substrate support including:

a base, a ceramic member disposed on the base and having a substrate support surface and a ring support surface, one or more annular members disposed on the ring support surface to surround the substrate on the substrate support surface, first and second electrodes embedded into the ceramic member, the first electrode being disposed below the substrate support surface, the second electrode being disposed below the first electrode, first and second vertical connectors embedded into the ceramic member and extending in a vertical direction, first and second annular connectors embedded into the ceramic member and extending in a horizontal direction, an inner region of the first annular connector being disposed below an edge region of the first electrode and electrically connected to the edge region of the first electrode through the first vertical connector, an inner region of the second annular connector being disposed below an edge region of the second electrode and electrically connected to the edge region of the second electrode through the second vertical connector, a central heater electrode embedded into the ceramic member and having one or more divided regions, the central heater electrode being disposed below the substrate support surface, an annular heater electrode embedded into the ceramic member and disposed below the ring support surface to surround the central heater electrode, an annular gap being formed between the central heater electrode and the annular heater electrode, and third and fourth vertical connectors embedded into the ceramic member and extending in a vertical direction through the annular gap;

a DC power source electrically connected to an outer region of the first annular connector through the third vertical connector and configured to generate a DC signal; and a voltage pulse generator electrically connected to an outer region of the second annular connector through the fourth vertical connector and configured to generate a sequence of voltage pulses.

* * * * *